United States Patent
Yeh et al.

(10) Patent No.: US 12,125,885 B2
(45) Date of Patent: Oct. 22, 2024

(54) SEMICONDUCTOR DEVICE AND MANUFACTURING METHOD THEREOF

(71) Applicant: UNITED MICROELECTRONICS CORP., Hsin-Chu (TW)

(72) Inventors: Chih-Tung Yeh, Taoyuan (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 577 days.

(21) Appl. No.: 17/401,301

(22) Filed: Aug. 12, 2021

(65) Prior Publication Data

US 2023/0015042 A1    Jan. 19, 2023

(30) Foreign Application Priority Data

Jul. 16, 2021    (CN) .......................... 202110804673.2

(51) Int. Cl.
*H01L 29/778* (2006.01)
*H01L 29/20* (2006.01)
*H01L 29/66* (2006.01)

(52) U.S. Cl.
CPC .... *H01L 29/2003* (2013.01); *H01L 29/66431* (2013.01); *H01L 29/7786* (2013.01); *H01L 29/7787* (2013.01)

(58) Field of Classification Search
CPC .......................... H01L 29/7787; H01L 29/7786
See application file for complete search history.

(56) References Cited

U.S. PATENT DOCUMENTS

| | | | |
|---|---|---|---|
| 9,461,122 B2 | 10/2016 | Kuraguchi | |
| 10,714,607 B1 | 7/2020 | Chiang | |
| 10,923,586 B2 | 2/2021 | Chiang | |
| 10,971,610 B2 | 4/2021 | Chang | |
| 10,985,264 B2 | 4/2021 | Chen | |
| 11,239,327 B2 | 2/2022 | Lee | |
| 2013/0083567 A1 | 4/2013 | Imada | |
| 2014/0252370 A1 | 9/2014 | Kwak | |
| 2019/0081165 A1 | 3/2019 | Huang | |

FOREIGN PATENT DOCUMENTS

FR    3 047 609 A1    8/2017

OTHER PUBLICATIONS

Machine translation of FR 3047609 published Aug. 11, 2017 (Year: 2017).*
Douglas, E. "Enhancement-mode AlGaN channel high electron mobility transistor enabled by p-AlGaN gate" J. Vac. Sci. Technol. B 37(2), Jun. 3, 2019) (Year: 2019).*
(Continued)

*Primary Examiner* — Grant S Withers
(74) *Attorney, Agent, or Firm* — Winston Hsu

(57) ABSTRACT

A semiconductor device includes a III-V compound semiconductor layer, a III-V compound barrier layer, a gate trench, and a p-type doped III-V compound layer. The III-V compound barrier layer is disposed on the III-V compound semiconductor layer. The gate trench is disposed in the III-V compound barrier layer. The p-type doped III-V compound layer is disposed in the gate trench, and a top surface of the p-type doped III-V compound layer and a top surface of the III-V compound barrier layer are substantially coplanar.

9 Claims, 10 Drawing Sheets

(56) References Cited

OTHER PUBLICATIONS

Okita, "Through recess and regrowth gate technology for realizing process stability of GaN-based gate injection transistors", IEEE Transactions on Electron Devices, vol. 64, No. 3, Mar. 2017.
Guo, "MBE-Regrown Ohmics in InAlN HEMTs With a regrowth interface resistance of 0.05 Ω.mm", IEEE Electron Device Letters, vol. 33, No. 4, Apr. 2012.

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a III-V compound semiconductor layer and a manufacturing method thereof.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and heterojunction is formed at the junction between the semiconductor materials as a channel for carriers. In recent years, gallium nitride (GaN) based materials have been applied in the high power and high frequency products because of the properties of wider bandgap and high saturation velocity. Two-dimensional electron gas (2DEG) may be generated by the piezoelectricity property of the GaN-based materials, and the switching velocity may be enhanced because of the higher electron velocity and the higher electron density of the 2DEG. Therefore, how to further improve the electrical performance of transistors formed with III-V compound materials by modifying materials, structures and/or manufacturing methods has become a research direction for people in the related fields.

SUMMARY OF THE INVENTION

A semiconductor device and a manufacturing method thereof are provided in the present invention. A p-type doped III-V compound layer is formed in a trench of a III-V compound barrier layer, and a top surface of the p-type doped III-V compound layer is substantially coplanar with a top surface of the III-V compound barrier layer for enhancing the material quality of the p-type doped III-V compound layer, improving the electrical performance of the semiconductor device, and/or simplifying related manufacturing process steps.

According to an embodiment of the present invention, a semiconductor device is provided. The semiconductor device includes a III-V compound semiconductor layer, a III-V compound barrier layer, a gate trench, and a p-type doped III-V compound layer. The III-V compound barrier layer is disposed on the III-V compound semiconductor layer. The gate trench is disposed in the III-V compound barrier layer. The p-type doped III-V compound layer is disposed in the gate trench. A top surface of the p-type doped III-V compound layer and a top surface of the III-V compound barrier layer are substantially coplanar.

According to an embodiment of the present invention, a manufacturing method of a semiconductor device is provided. The manufacturing method includes the following steps. A III-V compound barrier layer is formed on a III-V compound semiconductor layer. A gate trench is formed in the III-V compound barrier layer. A p-type doped III-V compound layer is formed in the gate trench. A top surface of the p-type doped III-V compound layer and a top surface of the III-V compound barrier layer are substantially coplanar.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-4 are schematic drawings illustrating a manufacturing method of a semiconductor device according to an embodiment of the present invention, wherein FIG. 3 is a schematic drawing in a step subsequent to FIG. 2, and FIG. 4 is a schematic drawing in a step subsequent to FIG. 3.

FIG. 13 and FIG. 14 are schematic drawings illustrating the manufacturing method of the semiconductor device according to the sixth embodiment of the present invention, wherein FIG. 14 is a schematic drawing in a step subsequent to FIG. 13.

FIG. 17 and FIG. 18 are schematic drawings illustrating the manufacturing method of the semiconductor device according to the seventh embodiment of the present invention, wherein FIG. 18 is a schematic drawing in a step subsequent to FIG. 17.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
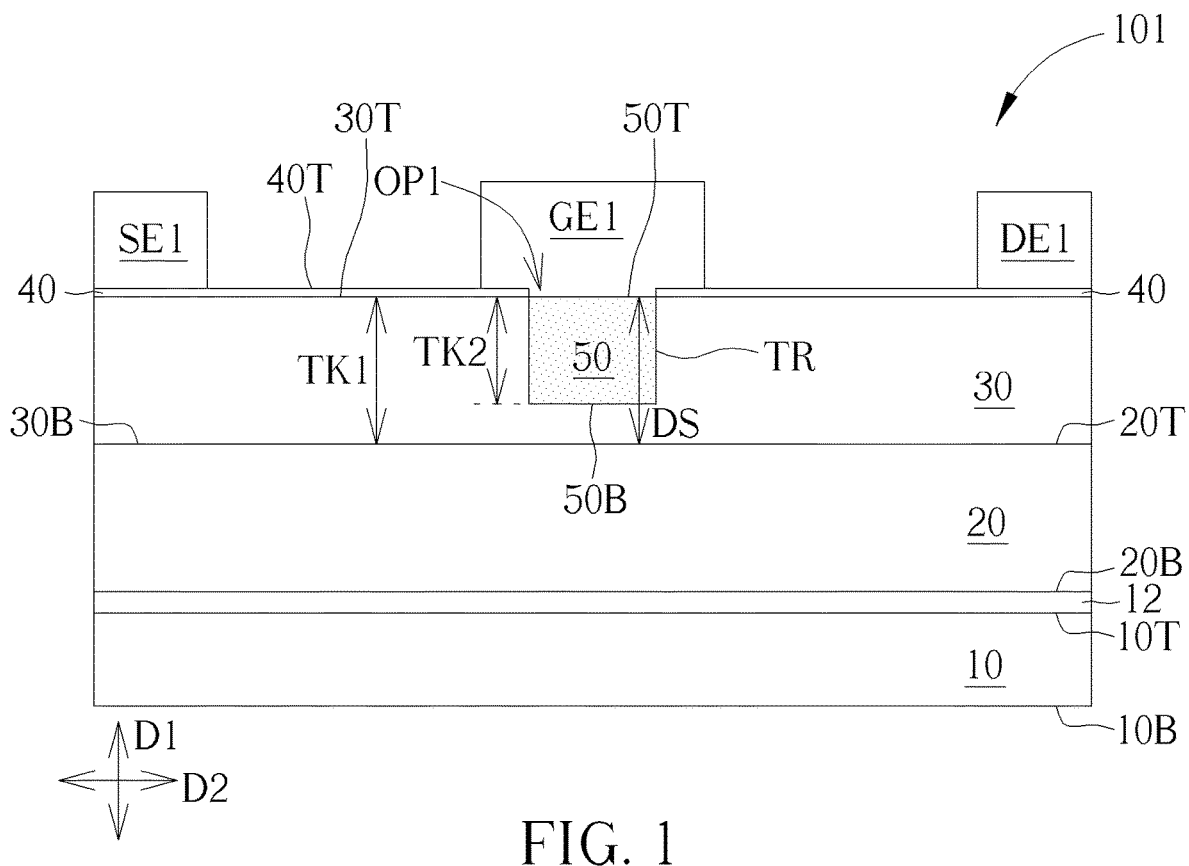
FIG. 1 is a schematic drawing illustrating a semiconductor device according to a first embodiment of the present invention.

Please refer to FIG. 1. FIG. 1 is a schematic drawing illustrating a semiconductor device 101 according to a first embodiment of the present invention. As shown in FIG. 1, the semiconductor device 101 includes a III-V compound semiconductor layer 20, a III-V compound barrier layer 30, a gate trench TR, and a p-type doped III-V compound layer 50. The III-V compound barrier layer 30 is disposed on the III-V compound semiconductor layer 20. The gate trench TR is disposed in the III-V compound barrier layer 30. The p-type doped III-V compound layer 50 is disposed in the gate trench TR. A top surface 50T of the p-type doped III-V compound layer 50 and a top surface 30T of the III-V compound barrier layer 30 are substantially coplanar. The p-type doped III-V compound layer 50 disposed in the gate trench TR may be used to reduce the electrical resistance of the semiconductor device 101, the semiconductor device 101 may have positive threshold voltage accordingly, and the semiconductor device 101 may be regarded as a normally-off transistor and/or enhancement mode (E-mode) transistor.

In some embodiments, the semiconductor device 101 may further include a substrate 10 and a buffer layer 12. The III-V compound semiconductor layer 20 may be disposed on the substrate 10, and the buffer layer 12 may be disposed between the substrate 10 and the III-V compound semiconductor layer 20 in a vertical direction (such as a first direction D1 shown in FIG. 1), such as being disposed between a top surface 10T of the substrate 10 and a bottom surface 20B of the III-V compound semiconductor layer 20. In some embodiments, the first direction D1 described above may be regarded as a thickness direction of the substrate 10, and the substrate 10 may have a top surface 10T and a bottom surface 10B opposite to the top surface 10T in the first direction D1. The buffer layer 12, the III-V compound semiconductor layer 20, the III-V compound barrier layer 30, and the p-type doped III-V compound layer 50 described above may be disposed at a side of the top surface 10T. In addition, a horizontal direction substantially orthogonal to the first direction D1 (such as a second direction D2 shown in FIG. 1 and other directions orthogonal to the first direction D1) may be substantially parallel with the top surface 10T and/or the bottom surface 10B of the substrate 10, but not limited thereto. Additionally, in this description, a distance between the bottom surface 10B of the substrate 10 and a relatively higher location and/or a relatively higher part in the vertical direction (such as the first direction D1) may be greater than a distance between the bottom surface 10B of the substrate 10 and a relatively lower location and/or a relatively lower part in the first direction D1. The bottom or a lower portion of each component may be closer to the bottom surface 10B of the substrate 10 in the first direction D1 than the top or upper portion of this component. Another component disposed above a specific component may be regarded as being relatively far from the bottom surface 10B of the substrate 10 in the first direction D1, and another component disposed under a specific component may be regarded as being relatively closer to the bottom surface 10B of the substrate 10 in the first direction D1.

In some embodiments, the semiconductor device 101 may further include an insulation layer 40, a gate electrode GE1, a source electrode SE1, and a drain electrode DE1. The insulation layer 40 may be disposed on the III-V compound barrier layer 30, and the insulation layer 40 may include an opening OP1 located corresponding to the gate trench TR in the first direction D1. The gate electrode GE1, the source electrode SE1, and the drain electrode DE1 may be disposed on the substrate 10. In some embodiments, the gate electrode GE1 may be disposed on the p-type doped III-V compound layer 50 and the insulation layer 40 in the first direction D1, and the source electrode SE1 and the drain electrode DE1 may be located at two opposite sides of the gate electrode GE1 in a horizontal direction (such as the second direction D2), respectively, and the source electrode SE1 and the drain electrode DE1 may be located on the III-V compound barrier layer 30 in the first direction D1. In some embodiments, the gate electrode GE1, the source electrode SE1, the drain electrode DE1, the p-type doped III-V compound layer 50, the insulation layer 40, the III-V compound barrier layer 30, and the III-V compound semiconductor layer 20 may constitute a transistor structure, such as a high electron mobility transistor (HEMT), but not limited thereto.

In the semiconductor device 101, the top surface 50T of the p-type doped III-V compound layer 50 and the top surface 30T of the III-V compound barrier layer 30 are substantially coplanar. In other words, under the influences of process variations and process uniformity, the top surface 50T may be slightly higher than the top surface 30T or slightly lower than the top surface 30T. For example, in some embodiments, a distance DS between the top surface 50T of the p-type doped III-V compound layer 50 and a bottom surface 30B of the III-V compound barrier layer 30 in the first direction D1 may be equal to a thickness TK1 of the III-V compound barrier layer 30 in the first direction D1 with a tolerance of ±10%. Therefore, the distance DS may be greater than or equal to 0.9 times the thickness TK1 and less than or equal to 1.1 times the thickness TK1.

Additionally, the gate trench TR does not penetrate through the III-V compound barrier layer 30 in the first direction D1. Therefore, a part of the III-V compound barrier layer 30 may be located between the gate trench TR and the III-V compound semiconductor layer 20 in the first direction D1, and a thickness TK2 of the p-type doped III-V compound layer 50 in the first direction D1 may be less than the thickness TK1 of the III-V compound barrier layer 30 in the first direction D1. The thickness TK1 of the III-V compound barrier layer 30 may be regarded as a distance between the top surface 30T and the bottom surface 30B of the III-V compound barrier layer 30 in the first direction D1, and the thickness TK2 of the p-type doped III-V compound layer 50 may be regarded as a distance between the top surface 50T and the bottom surface 50B of the p-type doped III-V compound layer 50 in the first direction D1. In some embodiments, a ratio of the thickness TK2 of the p-type doped III-V compound layer 50 to the thickness TK1 of the III-V compound barrier layer 30 (TK2/TK1) may be less than 1 and greater than or equal to 0.8 so as to make the p-type doped III-V compound layer 50 closer to the interface between the III-V compound barrier layer 30 and the III-V compound semiconductor layer 20 (such as a portion where the bottom surface 30B of the III-V compound barrier layer 30 is connected with a top surface 20T of the III-V compound semiconductor layer 20) for achieving the desired effects of positive threshold voltage and reducing electrical resistance and keeping the p-type doped III-V compound layer 50 from directly contacting the III-V compound semiconductor layer 20. For example, in some embodiments, the thickness TK1 of the III-V compound barrier layer 30 may range from 50 nanometers to 100 nanometers, and the thickness TK2 of the p-type doped III-V compound layer 50 may range from 40 nanometers to 90 nanometers.

In some embodiments, the opening OP1 and the gate trench TR may be formed by the same patterning process. Therefore, the opening OP1 may be disposed corresponding to the gate trench TR in the first direction D1, a projection area of the opening OP1 in the first direction D1 may be substantially the same as a projection area of the gate trench TR in the first direction D1, and the projection area of the opening OP1 and the projection area of the gate trench TR may overlap in the first direction D1. In some embodiments, the gate trench TR may be fully filled with the p-type doped III-V compound layer 50, and the p-type doped III-V compound layer 50 is not disposed outside the gate trench TR or slightly disposed outside the gate trench TR. Therefore, the top surface 50T of the p-type doped III-V compound layer 50 may be lower than a top surface 40T of the insulation layer 40 in the first direction D1, but not limited thereto. Additionally, in some embodiments, the gate electrode GE1 may be disposed on the p-type doped III-V compound layer 50 in the first direction D1 and directly connected with the p-type doped III-V compound layer 50, and a part of the gate electrode GE1 may be disposed on the top surface 40T of the insulation layer 40 in the first direction D1.

In some embodiments, the III-V compound semiconductor layer 20 may include gallium nitride (GaN), indium gallium nitride (InGaN), aluminum gallium nitride (AlGaN), or other suitable III-V compound semiconductor materials. The III-V compound barrier layer 30 may include aluminum gallium nitride, aluminum indium nitride (AlInN), aluminum gallium indium nitride (AlGaInN), aluminum nitride (AlN), or other suitable III-V compound barrier materials. The p-type doped III-V compound layer 50 may include p-type doped aluminum gallium nitride, p-type doped gallium nitride, or other suitable p-type doped III-V compound materials. In addition, the p-type dopant in the p-type doped III-V compound layer 50 may include cyclopentadienyl magnesium ($Cp_2Mg$), magnesium, beryllium (Be), zinc (Zn), a combination of the materials described above, or other suitable p-type dopants.

In some embodiments, the III-V compound semiconductor layer 20 may include a gallium nitride layer, the III-V compound barrier layer 30 may include an aluminum gallium nitride layer, and the p-type doped III-V compound layer 50 may include a p-type doped aluminum gallium nitride layer and/or a p-type doped gallium nitride layer. The p-type doped aluminum gallium nitride layer in the p-type doped III-V compound layer 50 may be formed directly by a suitable manufacturing process (such as an epitaxial growth process) and/or formed by aluminum diffusing from the III-V compound barrier layer 30 to the gallium nitride layer in the p-type doped III-V compound layer 50. Therefore, an atomic concentration of aluminum in the p-type doped III-V compound layer 50 may be lower than an atomic concentration of aluminum in the III-V compound barrier layer 30. In other words, the p-type doped III-V compound layer 50 may include a p-type doped $Al_xGa_{1-x}N$ layer, wherein x is less than 1 and greater than 0; or the p-type doped III-V compound layer 50 may include a p-type doped $Al_xGa_{1-x}N$ layer, wherein x is less than 1 and greater than or equal to 0, and the p-type doped III-V compound layer 50 is a p-type doped GaN layer when x is equal to 0.

In some embodiments, the substrate 10 may include a silicon substrate, a silicon carbide (SiC) substrate, a gallium nitride substrate, a sapphire substrate, or a substrate made of other suitable materials. The buffer layer 12 may include gallium nitride, aluminum gallium nitride, aluminum indium nitride, or other suitable buffer materials. The gate electrode GE1, the source electrode SE1, and the drain electrode DE1 may respectively include an electrically conductive metal material or other suitable electrically conductive materials. The electrically conductive metal materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stacked layer of the above-mentioned materials, or an alloy of the above-mentioned materials, but not limited thereto. The insulation layer 40 may include an oxide insulation material, a nitride insulation material, or other suitable insulation materials.

Figure 2:
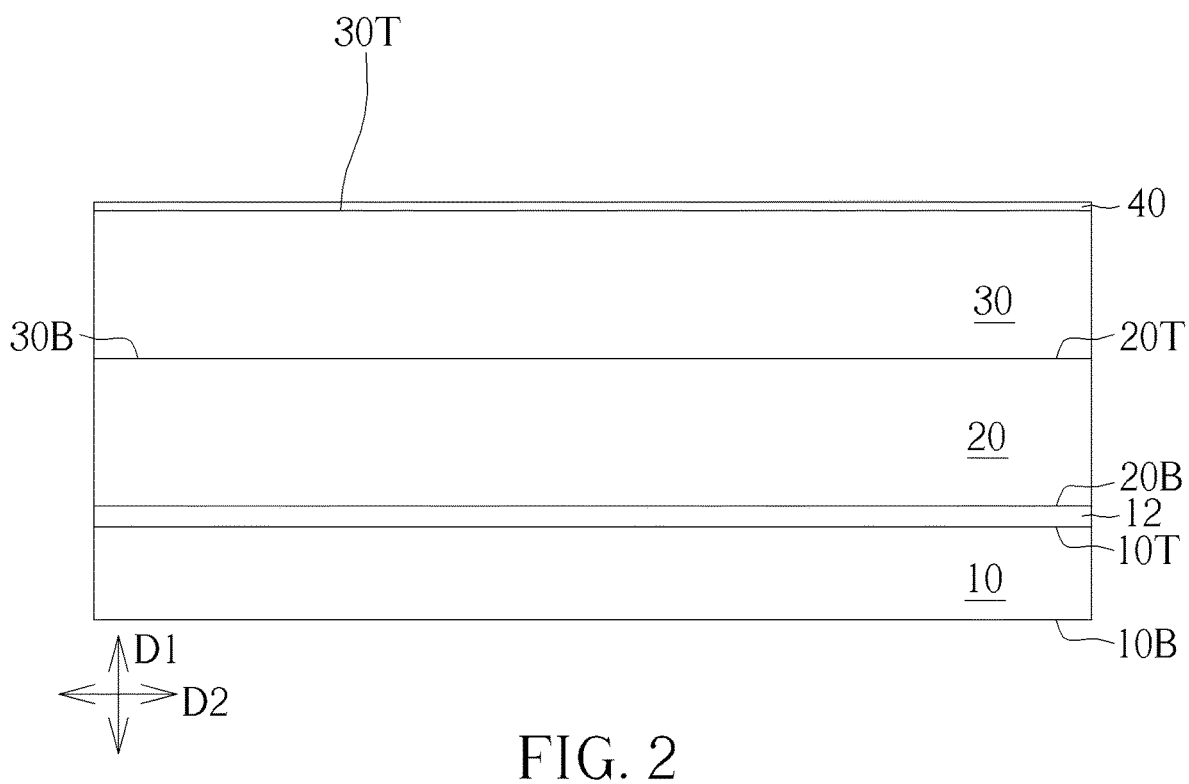
Figure 3:
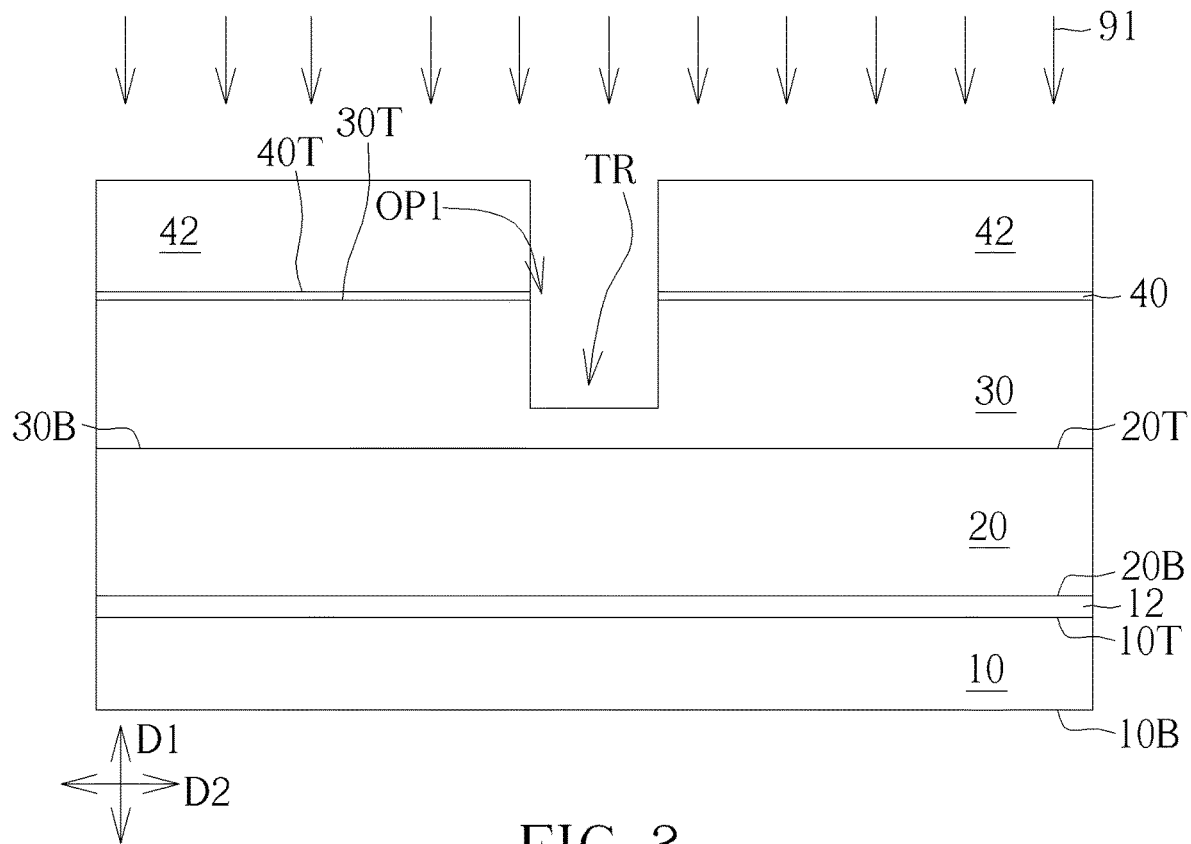
Figure 4:
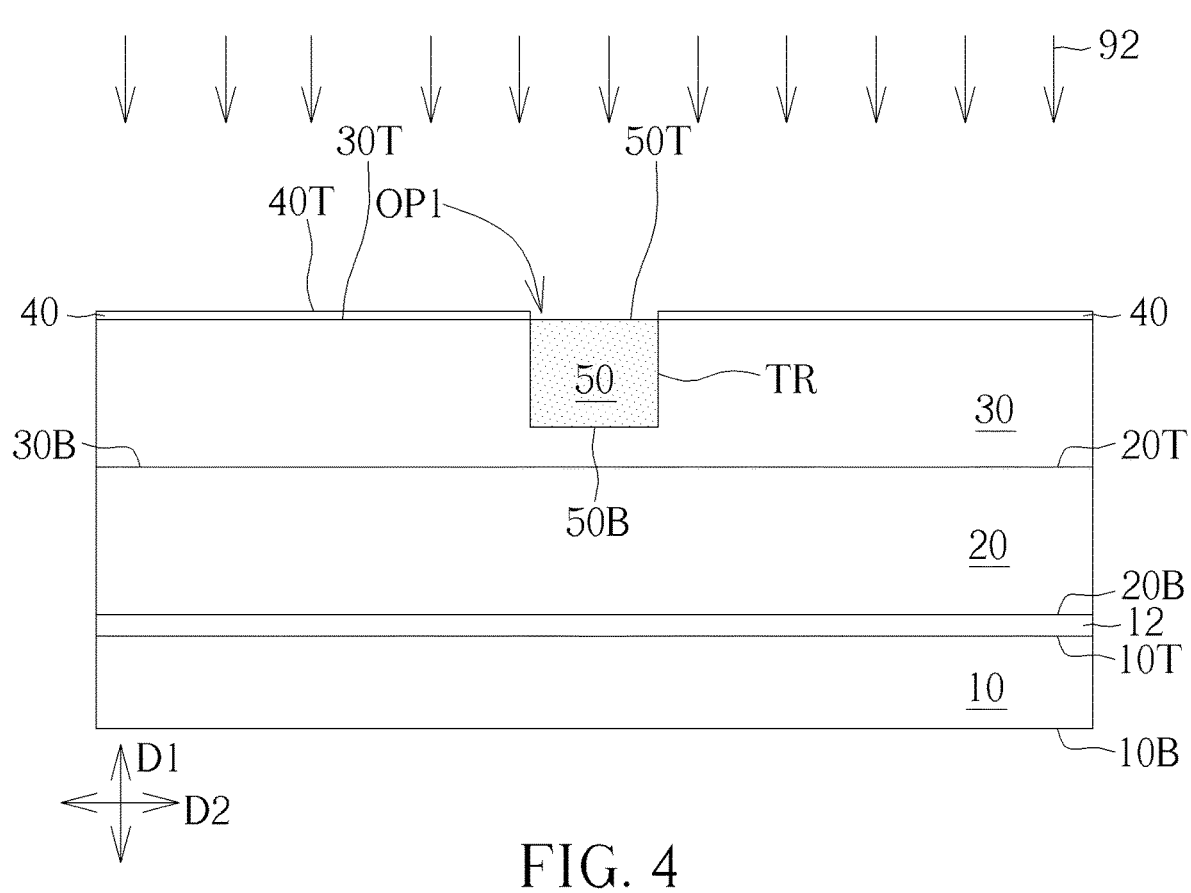

Please refer to FIGS. 1-4. FIGS. 2-4 are schematic drawings illustrating a manufacturing method of a semiconductor device according to an embodiment of the present invention, and FIG. 1 may be regarded as a schematic drawing in a step subsequent to FIG. 4. As shown in FIG. 1, the manufacturing method of the semiconductor device in this embodiment may include the following steps. The III-V compound barrier layer 30 is formed on the III-V compound semiconductor layer 20. The gate trench TR is formed in the III-V compound barrier layer 30. The p-type doped III-V compound layer 50 is formed in the gate trench TR. The top surface 50T of the p-type doped III-V compound layer 50 and the top surface 30T of the III-V compound barrier layer 30 are substantially coplanar.

Specifically, the manufacturing method of the semiconductor device in this embodiment may include but is not limited to the following steps. Firstly, as shown in FIG. 2, the buffer layer 12, the III-V compound semiconductor layer 20, and the III-V compound barrier layer 30 may be sequentially formed on the substrate 10, and an insulation layer 40 is formed on the III-V compound barrier layer 30. Subsequently, as shown in FIG. 3, the opening OP1 and the gate trench TR are formed. The opening OP1 penetrates through the insulation layer 40 in the first direction D1, and the opening OP1 is located corresponding to the gate trench TR in the first direction D1. In some embodiments, the opening OP1 and the gate trench TR may be formed by a patterning process 91. For example, in some embodiments, the patterning process 91 may include an etching step, a patterned mask layer 42 may be formed on the insulation layer 40 before the etching step, and the opening OP1 and the gate trench TR may be formed by etching the insulation layer 40 and the III-V compound barrier layer 30 with the patterned mask layer 42 as an etching mask. As shown in FIG. 3 and FIG. 4, after the patterning process 91, the patterned mask layer 42 may be removed, and an epitaxial growth process 92 may be carried out for forming the p-type doped III-V compound layer 50 in the gate trench TR. In some embodiments, the epitaxial growth process 92 may include a selective epitaxial growth process, and the p-type doped III-V compound layer 50 may be formed by epitaxial growth starting from the surface of the III-V compound barrier layer 30 exposed by the gate trench TR without epitaxial growth starting from the insulation layer 40 and the top surface 30T of the III-V compound barrier layer 30 covered by the insulation layer 40. In addition, by the material selection and/or the process condition control of the epitaxial growth, the growing rate of the p-type doped III-V compound layer 50 from the inner sidewall of the gate trench TR may be higher than the growing rate of the p-type doped III-V compound layer 50 from the bottom surface of the gate trench TR. In this way, the p-type doped III-V compound layer 50 may be controlled to be formed in the gate trench TR and may be less likely to be formed outside the gate trench TR.

Subsequently, as shown in FIG. 4 and FIG. 1, after the step of forming the p-type doped III-V compound layer 50, the gate electrode GE1, the source electrode SE1, and the drain electrode DE1 may be formed for forming the semiconductor device 101. In some embodiments, the gate electrode GE1 may be formed on the p-type doped III-V compound layer 50 and the insulation layer 40, and the source electrode SE1 and the drain electrode DE1 may be formed on the insulation layer 40, but not limited thereto. In some embodiments, the source electrode SE1 and the drain electrode DE1 may respectively extend to be partially located in the III-V compound barrier layer 30. By the manufacturing method in this embodiment, the p-type doped III-V compound layer 50 may be formed self-aligned in the gate trench TR. Therefore, it is not necessary to perform an etching process to the p-type doped III-V compound layer 50, and etching damage to the p-type doped III-V compound layer 50 and/or III-V compound barrier layer 30 by the etching process may be avoided. The material quality of the p-type doped III-V compound layer 50 may be enhanced, the electrical performance of the semiconductor device may be improved, and/or the related manufacturing process steps may be simplified accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
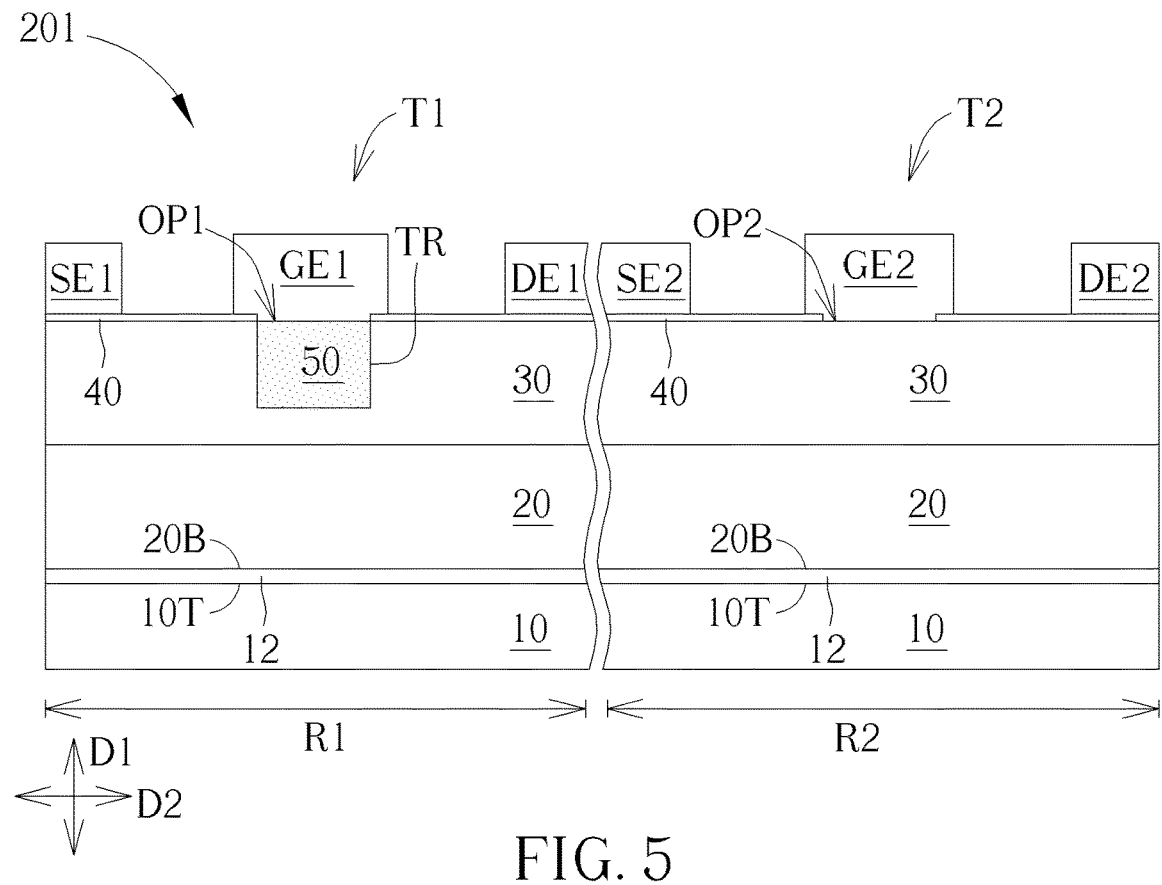
FIG. 5 is a schematic drawing illustrating a semiconductor device according to another embodiment of the present invention.

Please refer to FIG. 5. FIG. 5 is a schematic drawing illustrating a semiconductor device 201 according to another embodiment of the present invention. As shown in FIG. 5, in some embodiments, the substrate 10 may include a first region R1 and a second region R2. The buffer layer 12, the III-V compound semiconductor layer 20, the III-V compound barrier layer 30, and the insulation layer 40 described above may be disposed above the first region R1 and the second region R2 of the substrate 10. The gate trench TR, the p-type doped III-V compound layer 50, and the opening OP1 described above may be disposed above the first region R1 of the substrate 10. The gate electrode GE1 described above may be regarded as a first gate electrode disposed above the first region R1 of the substrate 10, and the source electrode SE1 and the drain electrode DE1 described above may be regarded as a first source electrode and a first drain electrode disposed above the first region R1 of the substrate 10. In addition, the semiconductor device 201 may further include a second gate electrode (such as a gate electrode GE2 shown in FIG. 5), a second source electrode (such as a source electrode SE2 shown in FIG. 5), and a second drain electrode (such as a drain electrode DE2 shown in FIG. 5) disposed above the second region R2 of the substrate 10. The gate electrode GE2 may be disposed on the III-V compound barrier layer 30 and the insulation layer 40 located above the second region R2, and the gate electrode GE2 may be disposed corresponding to another opening OP2 in the insulation layer 40. The opening OP2 may expose the III-V compound barrier layer 30 located above the second region R2, and the gate electrode GE2 may contact the III-V compound barrier layer 30 via the opening OP2. The source electrode SE1 and the drain electrode DE2 may be located at two opposite sides of the gate electrode GE2 in a horizontal direction (such as the second direction D2), respectively, and the source electrode SE2 and the drain electrode DE2 may be located on the III-V compound barrier layer 30 above the second region R2 in the first direction D1.

In some embodiments, the material composition of the gate electrode GE2 may be similar to the material composition of the gate electrode GE1, and the material composition of the source electrode SE2 and the drain electrode DE2 may be similar to the material composition of the source electrode SE1 and the drain electrode DE1, but not limited thereto. In some embodiments, the gate electrode GE1, the source electrode SE1, the drain electrode DE1, the p-type doped III-V compound layer 50, the insulation layer 40 located above the first region R1, the III-V compound barrier 30 located above the first region R1, and the III-V compound semiconductor layer 20 located above the first region R1 may constitute a first transistor structure T1. The gate electrode GE2, the source electrode SE2, the drain electrode DE2, the insulation layer 40 located above the second region R2, the III-V compound barrier 30 located above the second region R2, and the III-V compound semiconductor layer 20 located above the second region R2 may constitute a second transistor structure T2. The first transistor structure T1 including the p-type doped III-V compound layer 50 may be regarded as an E-mode transistor, and the second transistor structure T2 without the gate trench TR and the p-type doped III-V compound layer 50 may be regarded as a depletion mode (D-mode) transistor, but not limited thereto.

Figure 6:
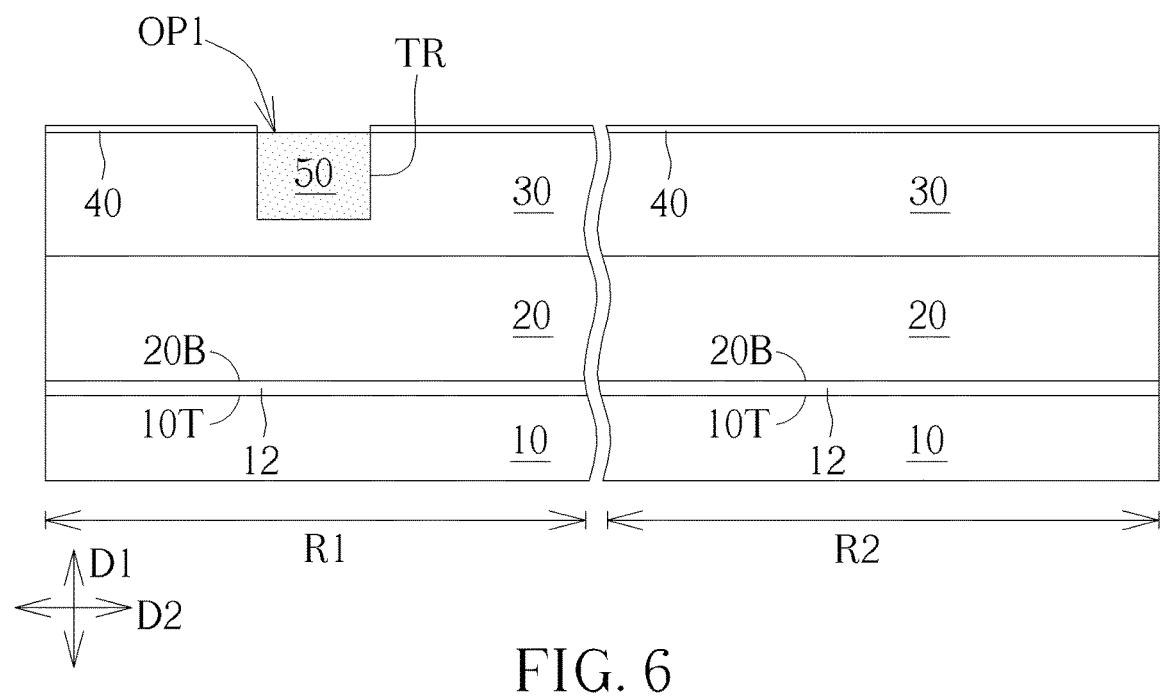
FIG. 6 is a schematic drawing illustrating a manufacturing method of a semiconductor device according to another embodiment of the present invention.

Please refer to FIG. 5 and FIG. 6. FIG. 6 is a schematic drawing illustrating a manufacturing method of a semiconductor device according to another embodiment of the present invention, and FIG. 5 may be regarded as a schematic drawing in a step subsequent to FIG. 6. As shown in FIG. 6, the buffer layer 12, the III-V compound semiconductor layer 20, the III-V compound barrier layer 30, and the insulation layer 40 may be formed above the first region R1 and the second region R2 of the substrate 10, and the gate trench TR, the p-type doped III-V compound layer 50, and the opening OP1 may be formed above the first region R1 of the substrate 10. The III-V compound barrier layer 30 on the second region R2 may be completely covered by the insulation layer 40 during the step of forming the p-type doped III-V compound layer 50 for avoiding forming the p-type doped III-V compound layer 50 by the epitaxial growth process on the III-V compound barrier layer 30 above the second region R2. Subsequently, as shown in FIG. 6 and FIG. 5, after the step of forming the p-type doped III-V compound layer 50, the gate electrode GE1, the source electrode SE1, and the drain electrode DE1 may be formed on the first region R1, and the gate electrode GE2, the source electrode SE2, and the drain electrode DE2 may be formed on the second region R2. The gate electrode GE1 may be formed above the III-V compound barrier layer 30 located on the first region R1 and formed corresponding to the opening OP1 in the first direction D1, and the gate electrode GE2 may be formed above the III-V compound barrier layer 30 located on the second region R2 and formed corresponding to the opening OP2 in the first direction D1. In some embodiments, the gate electrode GE1 and the gate electrode GE2 may be formed concurrently by the same process (such as a film forming process of an electrically conductive layer and a patterning process performed to this electrically conductive layer) and have the same material composition accordingly, and the opening OP2 may be formed in the insulation layer 40 after the step of forming the p-type doped III-V compound layer 50 and before the step of forming the gate electrode GE2. In addition, the source electrode SE1 and the drain electrode DE1 may be a source electrode and a drain electrode of the first transistor structure T1 including the gate electrode GE1 and formed above the III-V compound barrier layer 30 located on the first region R1. The source electrode SE2 and the drain electrode DE2 may be a source electrode and a drain electrode of the second transistor structure T2 including the gate electrode GE2 and formed above the III-V compound barrier layer 30 located on the second region R2. In some embodiments, the source electrode SE1, the drain electrode DE1, the source electrode SE2, and the drain electrode DE2 may be formed concurrently by the same process (such as a film forming process of an electrically conductive layer and a patterning process performed to this electrically conductive layer) and have the same material composition accordingly, but not limited thereto. In other words, at least a part of the first transistor structure T1 and at least a part of the second transistor structure T2 with different modes may be formed concurrently by the same process for manufacturing process simplification.

Figure 7:
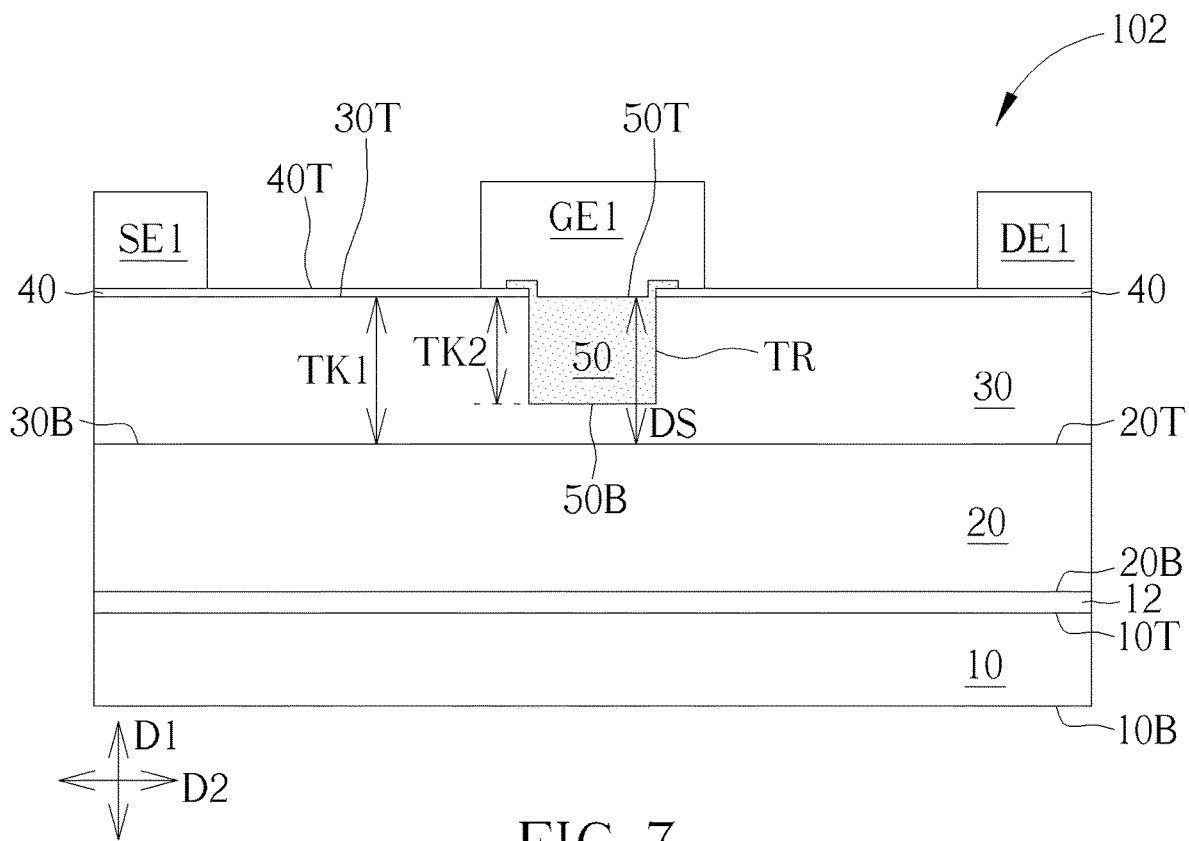
FIG. 7 is a schematic drawing illustrating a semiconductor device according to a second embodiment of the present invention.

Please refer to FIG. 7. FIG. 7 is a schematic drawing illustrating a semiconductor device 102 according to a second embodiment of the present invention. As shown in FIG. 7, in some embodiments, a part of the p-type doped III-V compound layer 50 may be disposed on the insulation layer 40 in the first direction D1, and the p-type doped III-V compound layer 50 on the insulation layer 40 may be located between the insulation layer 40 and the gate electrode GE1 in the first direction D1. For example, the p-type doped III-V compound layer 50 formed by the epitaxial growth process may be formed partly outside the gate trench TR, and a part of the p-type doped III-V compound layer 50 may be formed on the insulation layer 40 in the first direction D1 accordingly, but not limited thereto. In addition, the allocation of the p-type doped III-V compound layer 50 in this embodiment may be applied to other embodiments of the present invention (such as being applied to the first transistor structure T1 in FIG. 5 described above and other embodiments below) according to some design considerations.

Figure 8:
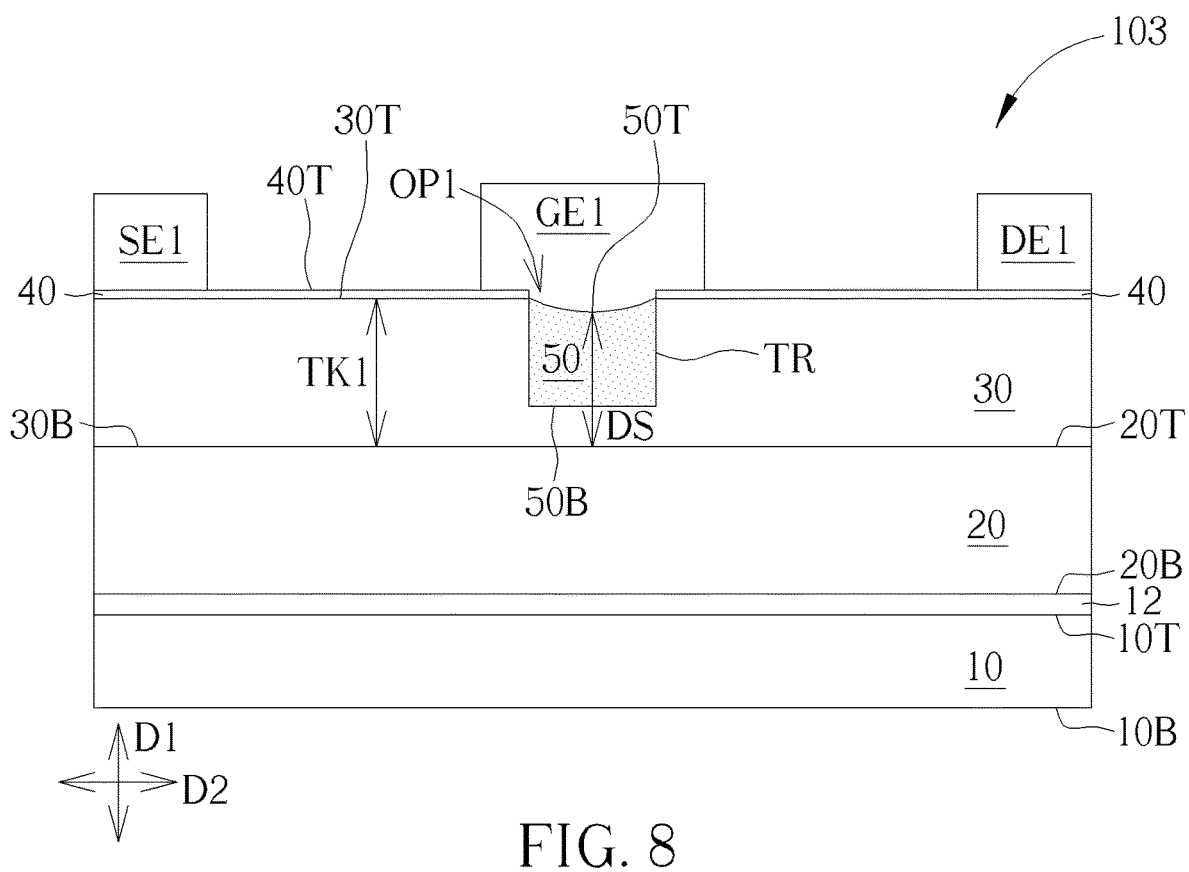
FIG. 8 is a schematic drawing illustrating a semiconductor device according to a third embodiment of the present invention.

Please refer to FIG. 8. FIG. 8 is a schematic drawing illustrating a semiconductor device 103 according to a third embodiment of the present invention. As shown in FIG. 8, in some embodiments, the top surface 50T of the p-type doped III-V compound layer 50 may include a concave surface. A portion of the top surface 50T (such as the bottommost portion) may be slightly lower than the top surface 30T of the III-V compound barrier layer 30 in the first direction D1, and the distance DS between the top surface 50T and the bottom surface 30B of the II-v compound barrier layer 30 in the first direction D1 may be slightly less than the thickness TK1 of the III-V compound barrier layer 30 in the first direction D1. In some embodiments, before the step of forming the gate electrode GE1, a planarization process (such as a chemical mechanical polishing process or other suitable planarization approaches) may be performed to the p-type doped III-V compound layer 50 for removing the p-type doped III-V compound layer 50 located outside the gate trench TR (such as the p-type doped III-V compound layer 50 shown in FIG. 7 described above), and the top surface 50T of the p-type doped III-V compound layer 50 may be influenced by the planarization process and may be a slightly concave surface accordingly. Additionally, the p-type doped III-V compound layer 50 with the top surface 50T which is concave may be applied to other embodiments of the present invention (such as being applied to the first transistor structure T1 in FIG. 5 described above and other embodiments below) according to some design considerations.

Figure 9:
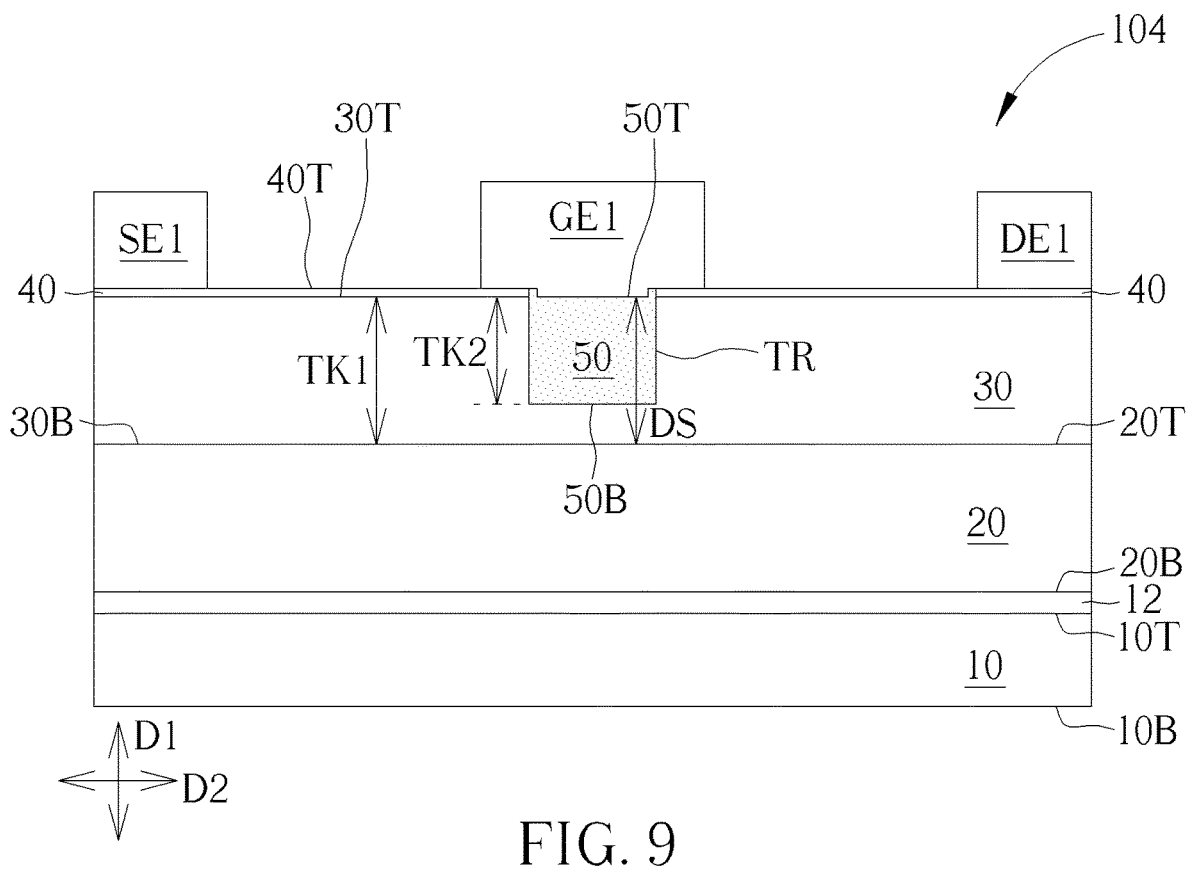
FIG. 9 is a schematic drawing illustrating a semiconductor device according to a fourth embodiment of the present invention.

Please refer to FIG. 9. FIG. 9 is a schematic drawing illustrating a semiconductor device 104 according to a fourth embodiment of the present invention. As shown in FIG. 9, in some embodiments, a part of the p-type doped III-V compound layer 50 may be disposed on a sidewall of the insulation layer 40 in the horizontal direction (such as the second direction D2), and the top surface 50T of the p-type doped III-V compound layer 50 may be regarded as a recess surface, but not limited thereto. In addition, the allocation of the p-type doped III-V compound layer 50 in this embodiment may be applied to other embodiments of the present invention (such as being applied to the first transistor structure T1 in FIG. 5 described above and other embodiments below) according to some design considerations.

Figure 10:
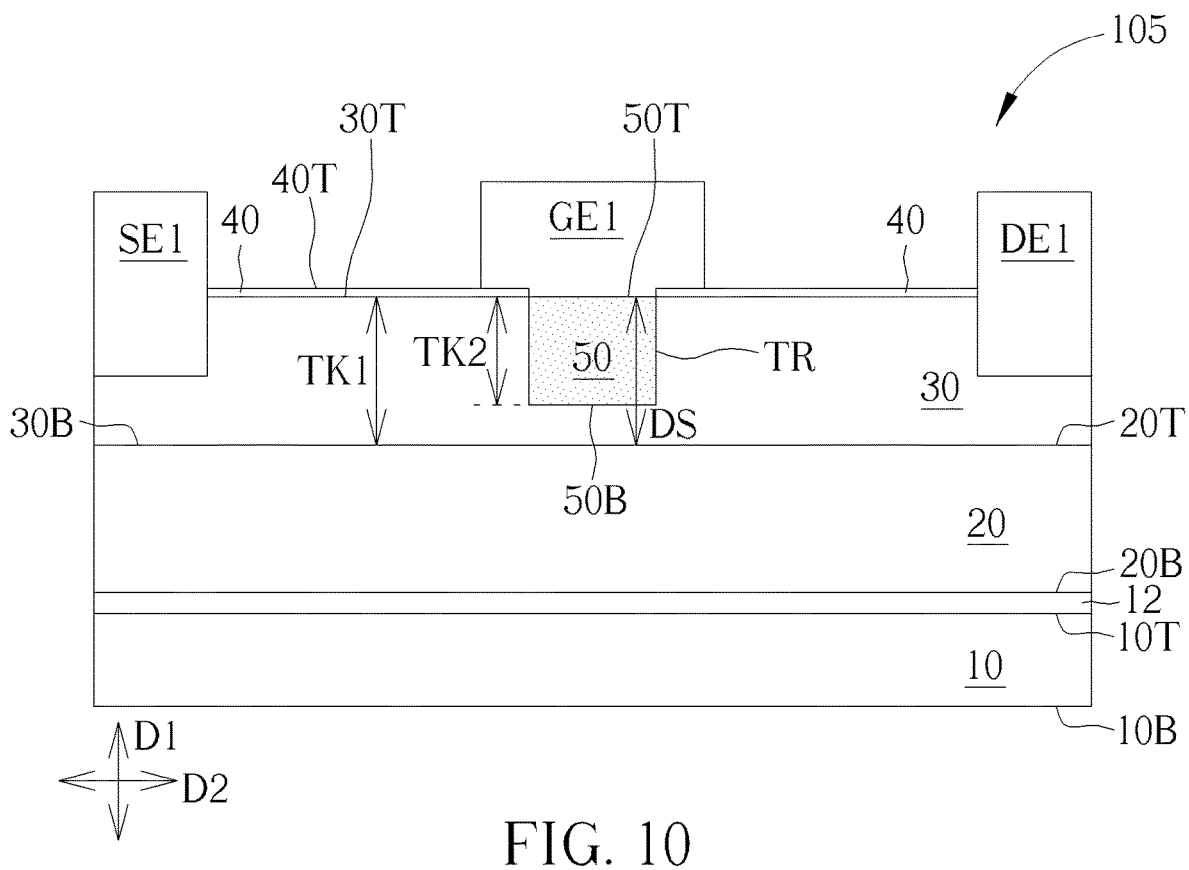
FIG. 10 is a schematic drawing illustrating a semiconductor device according to a fifth embodiment of the present invention.

Please refer to FIG. 10. FIG. 10 is a schematic drawing illustrating a semiconductor device 105 according to a fifth embodiment of the present invention. As shown in FIG. 10, in some embodiments, the source electrode SE1 and the drain electrode DE1 may penetrate through the insulation layer 40 in the first direction D1, respectively, for being partly disposed in the III-V compound barrier layer 30. In addition, the allocation of the source electrode SE1 and the drain electrode DE1 in this embodiment may be applied to other embodiments of the present invention (such as being applied to the first transistor structure T1 in FIG. 5 described above and other embodiments below) according to some design considerations.

Figures 11, 12:
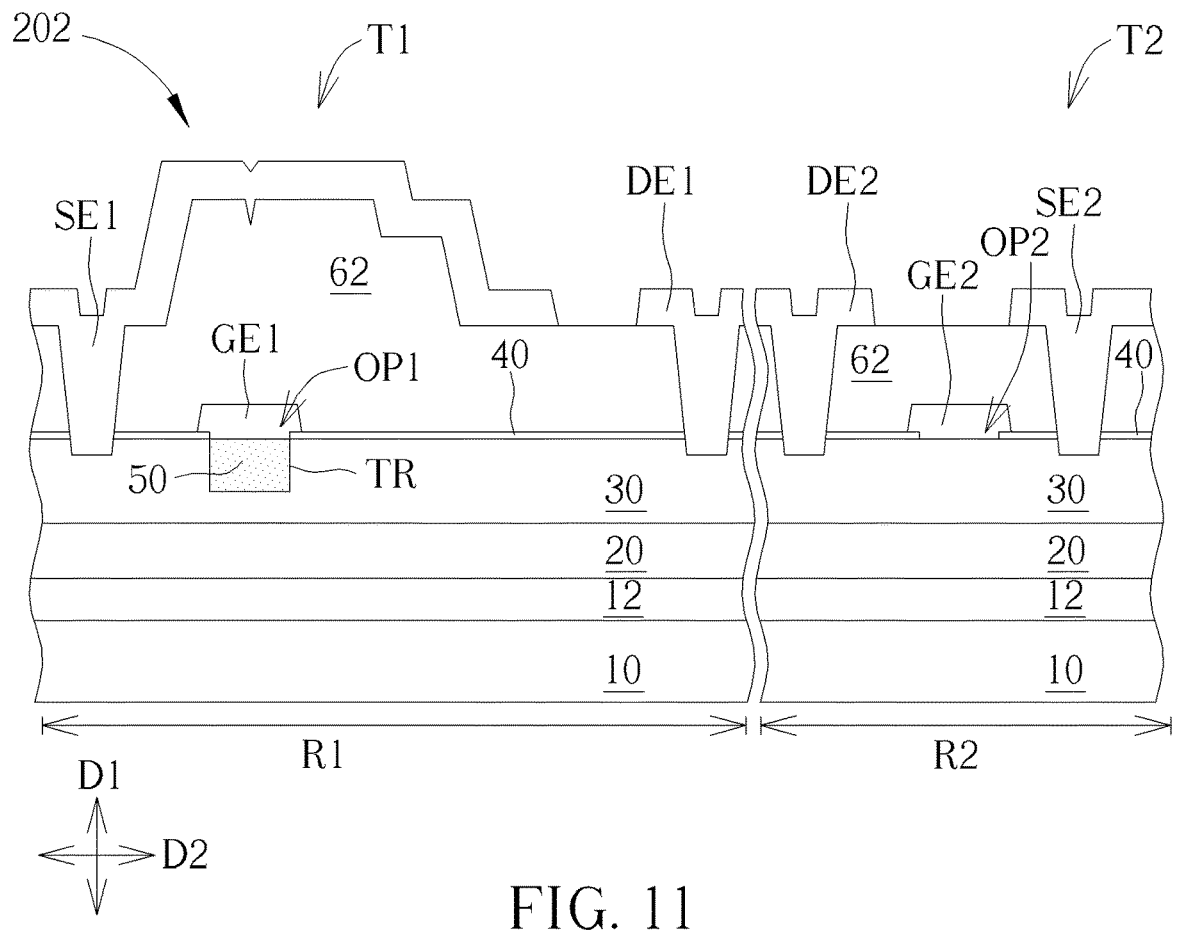
FIG. 11 is a schematic drawing illustrating a semiconductor device according to a sixth embodiment of the present invention.
FIG. 12 is a schematic flow chart of a manufacturing method of the semiconductor device according to the sixth embodiment of the present invention.

Please refer to FIG. 11. FIG. 11 is a schematic drawing illustrating a semiconductor device 202 according to a sixth embodiment of the present invention. As shown in FIG. 11, the difference between the semiconductor device 202 and the semiconductor device 201 shown in FIG. 5 described above is that the semiconductor device 202 may further include a dielectric layer 62. The dielectric layer 62 may cover the insulation layer 40, the gate electrode GE1, and the gate electrode GE2, and the source electrode SE1, the drain electrode DE1, the source electrode SE2, and the drain electrode DE2 may respectively penetrate through the dielectric layer 62 and the insulation layer 40 for being partly disposed in the III-V compound barrier layer 30. The dielectric layer 62 may include a single layer or multiple layers of dielectric materials, such as an oxide dielectric material or other suitable dielectric materials. In some embodiments, a part of the source electrode SE1 may be disposed on the dielectric layer 62 and located between the gate electrode GE1 and the drain electrode DE1 for adjusting the electric field distribution between the gate electrode GE1 and the drain electrode DE1, but not limited thereto.

Figure 13:
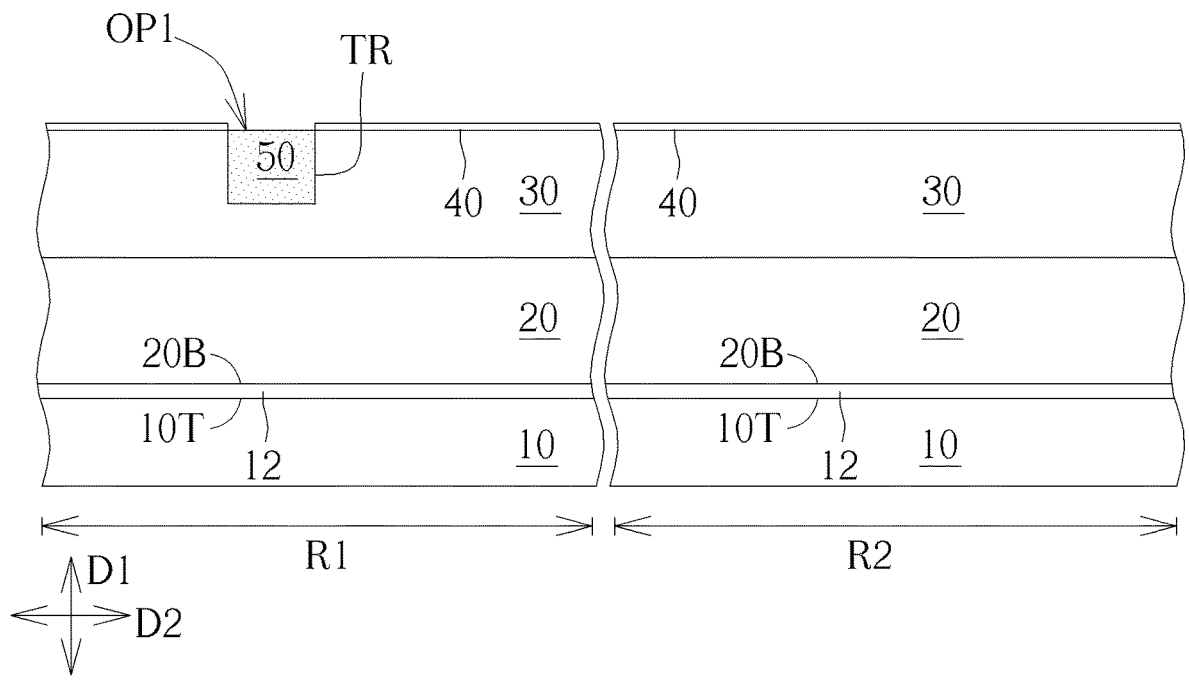
Figure 14:
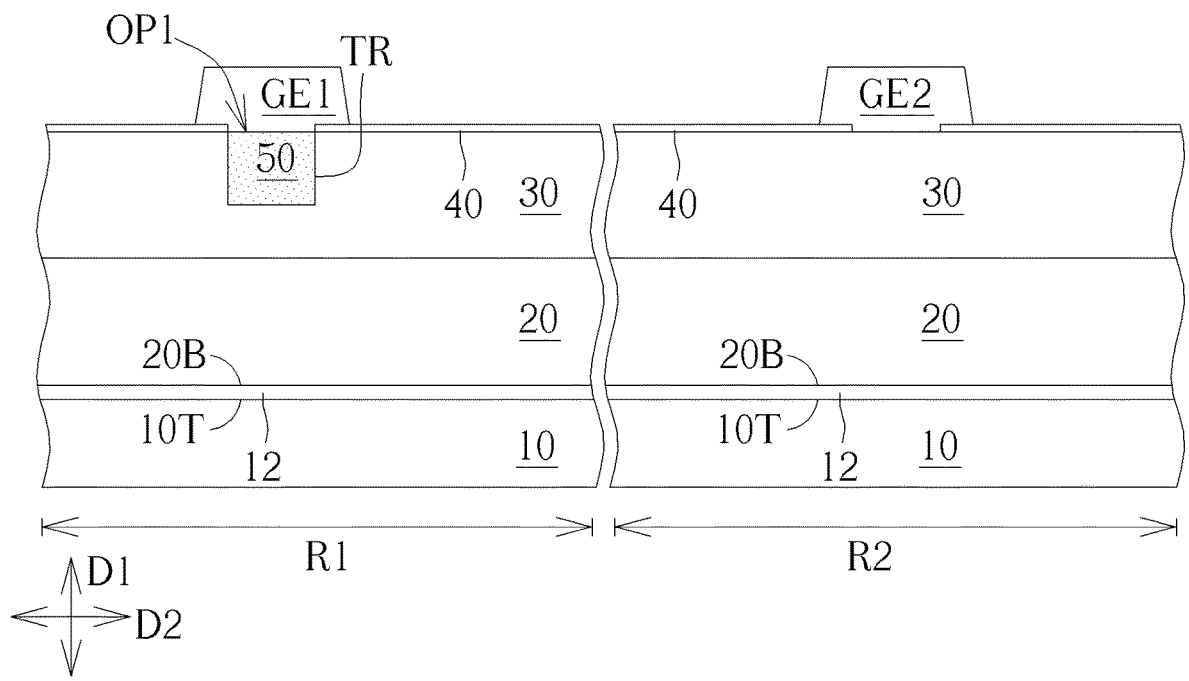

Please refer to FIGS. 11-14. FIG. 12 is a schematic flow chart of a manufacturing method of the semiconductor device 202 according to the sixth embodiment of the present invention, FIG. 13 and FIG. 14 are schematic drawings illustrating the manufacturing method of the semiconductor device in this embodiment, and FIG. 11 may be regarded as a schematic drawing in a step subsequent to FIG. 14. As shown in FIG. 12 and FIG. 13, in some embodiments, step S10 may be carried out for sequentially forming the buffer layer 12, the III-V compound semiconductor layer 20, the III-V compound barrier layer 30, and the insulation layer 40. The opening OP1 is then formed in the insulation layer 40 located on the first region R1, and the gate trench TR is formed in the III-V compound barrier layer 30 located above the first region R1. Subsequently, step S11 may be carried out for forming the p-type doped III-V compound layer 50 in the gate trench TR. The III-V compound barrier layer 30 located above the second region R2 may be completely covered by the insulation layer 40 during the step of forming the p-type doped III-V compound layer 50 for avoiding forming the p-type doped III-V compound layer 50 by the epitaxial growth process on the III-V compound barrier layer 30 located above the second region R2. Subsequently, as shown in FIG. 12 and FIG. 14, step S12 may be carried out for forming the gate structure GE1 and the gate structure GE2. In some embodiments, the opening OP2 may be formed after the step of forming the p-type doped III-V compound layer 50 and before the step of forming the gate electrode GE2, but not limited thereto. As shown in FIG. 12 and FIG. 11, after the step of forming the gate electrode GE1 and the gate electrode GE2, step S13 may be carried out for forming the dielectric layer 62 covering the gate electrode GE1, the gate electrode GE2, and the insulation layer 40. After the step of forming the dielectric layer 62, step S14 may be carried out for forming the source electrode SE1, the drain electrode DE1, the source electrode SE2, and the drain electrode DE2. In other words, the gate electrode and the source/drain electrode may be formed by different manufacturing processes, respectively. The gate electrode GE1 and the gate electrode GE2 may be formed before the step of forming the source electrode SE1, the drain electrode DE1, the source electrode SE2, and the drain electrode DE2. The first transistor structure T1 and the second transistor structure T2 with different modes may be formed concurrently on the same substrate 10, and at least a part of the first transistor structure T1 and at least a part of the second transistor structure T2 (such as the gate electrodes or the source/drain electrodes) may be formed concurrently by the same process for manufacturing process simplification. In addition, because the enhancement mode of the first transistor structure T1 may be achieved by forming the gate trench TR in the III-V compound barrier layer 30 and forming the p-type doped III-V compound layer 50 in the gate trench TR, the first transistor structure T1 and the second transistor structure T2 with different modes may be manufactured on the same substrate 10, and some material layers (such as the buffer layer 12, the III-V compound semiconductor layer 20, and/or the III-V compound barrier layer 30) located corresponding to the first transistor structure T1 and the second transistor structure T2 may be formed concurrently on the same substrate 10.

Figure 15:
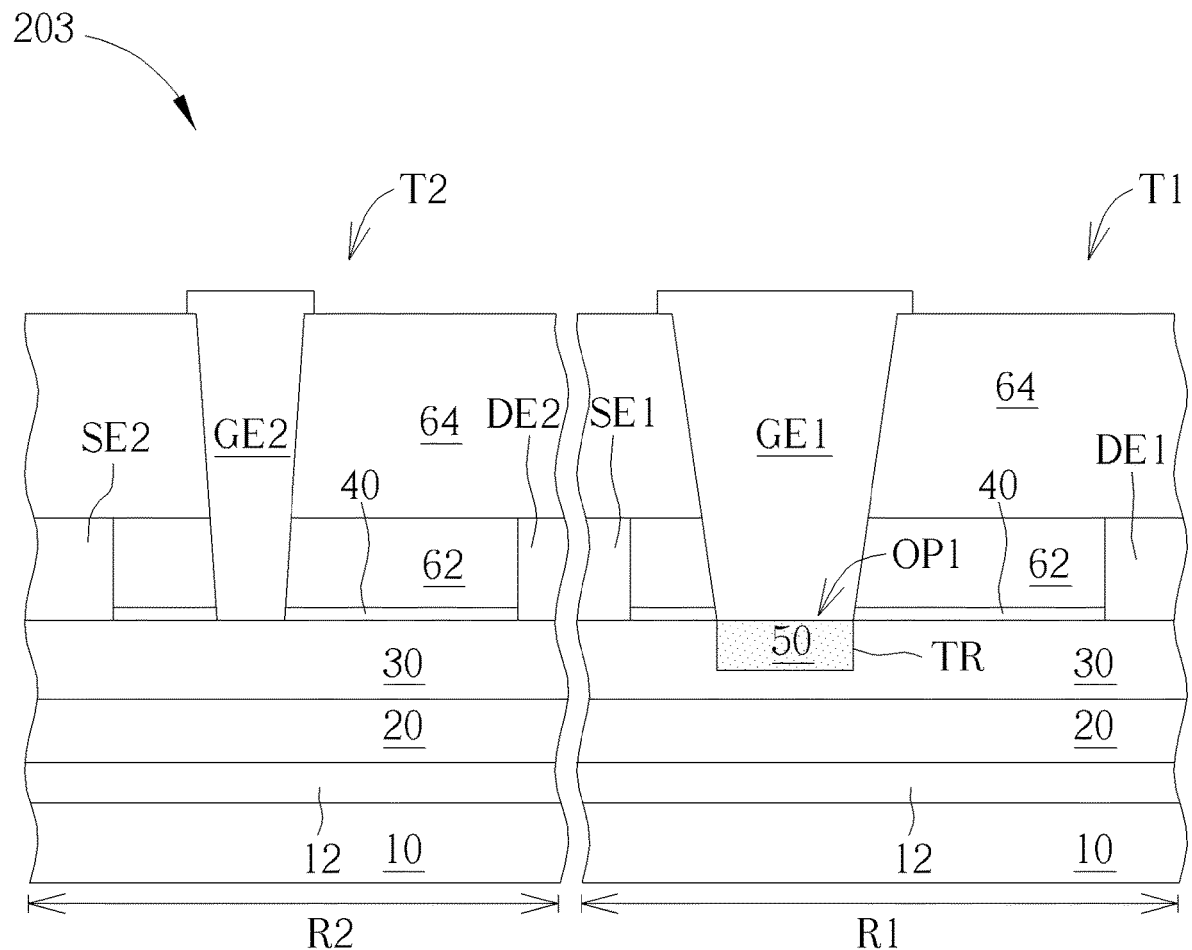
FIG. 15 is a schematic drawing illustrating a semiconductor device according to a seventh embodiment of the present invention.

Please refer to FIG. 15. FIG. 15 is a schematic drawing illustrating a semiconductor device 203 according to a seventh embodiment of the present invention. The difference between the semiconductor device 203 and the semiconductor device 201 shown in FIG. 5 described above is that the semiconductor device 203 may further include the dielectric layer 62 and a dielectric layer 64. The dielectric layer 62 may be disposed on the insulation layer 40, and the dielectric layer 64 may be disposed on the dielectric layer 62. The source electrode SE1, the drain electrode DE1, the source electrode SE2, and the drain electrode DE2 may respectively penetrate through the dielectric layer 62 and the insulation layer 40 in the first direction D1 for contacting the III-V compound barrier layer 30. The gate electrode GE1 may penetrate through the dielectric layer 64 and the dielectric layer 62 in the first direction D1 for being connected with the p-type doped III-V compound layer 50, and the gate electrode GE2 may penetrate through the dielectric layer 64, the dielectric layer 62, and the insulation layer 40 in the first direction D1 for contacting the III-V compound barrier layer 30. The dielectric layer 64 may include a single layer or multiple layers of dielectric materials, such as an oxide dielectric material or other suitable dielectric materials.

Figure 16:
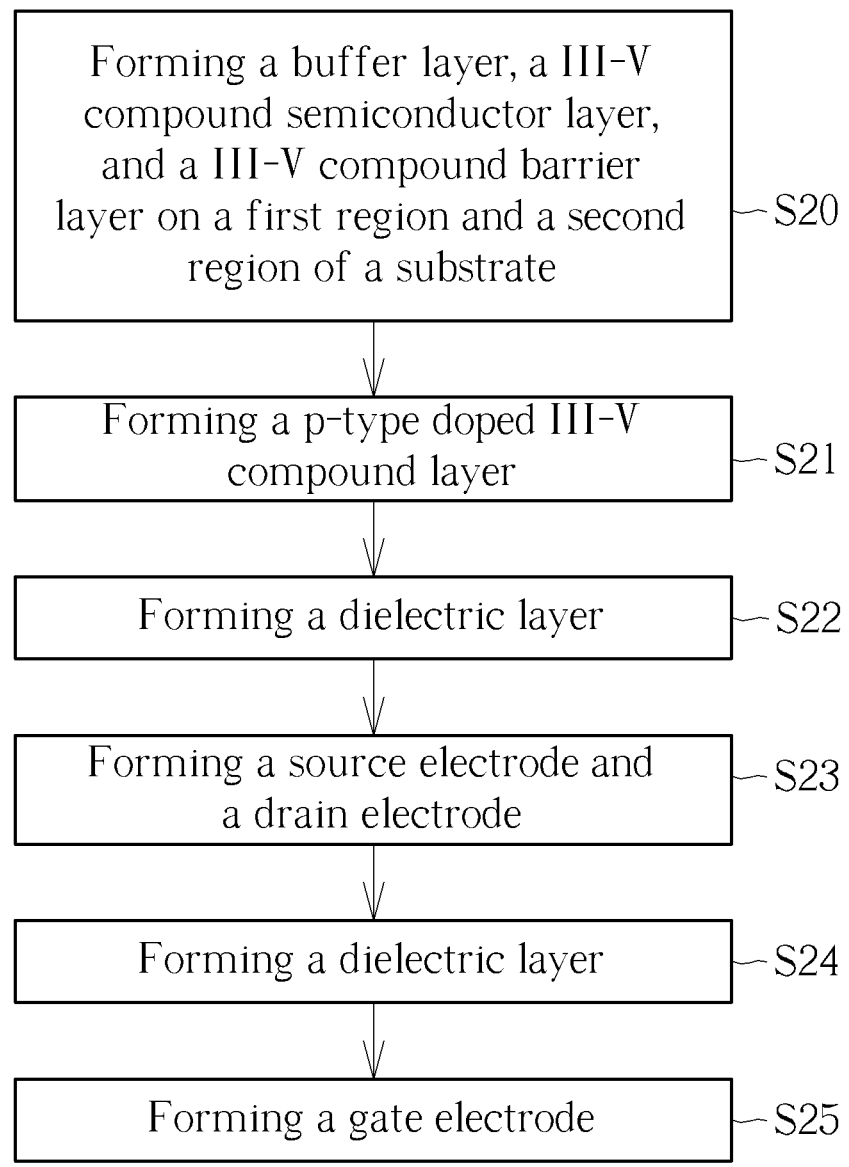
FIG. 16 is a schematic flow chart of a manufacturing method of the semiconductor device according to the seventh embodiment of the present invention.
Figure 17:
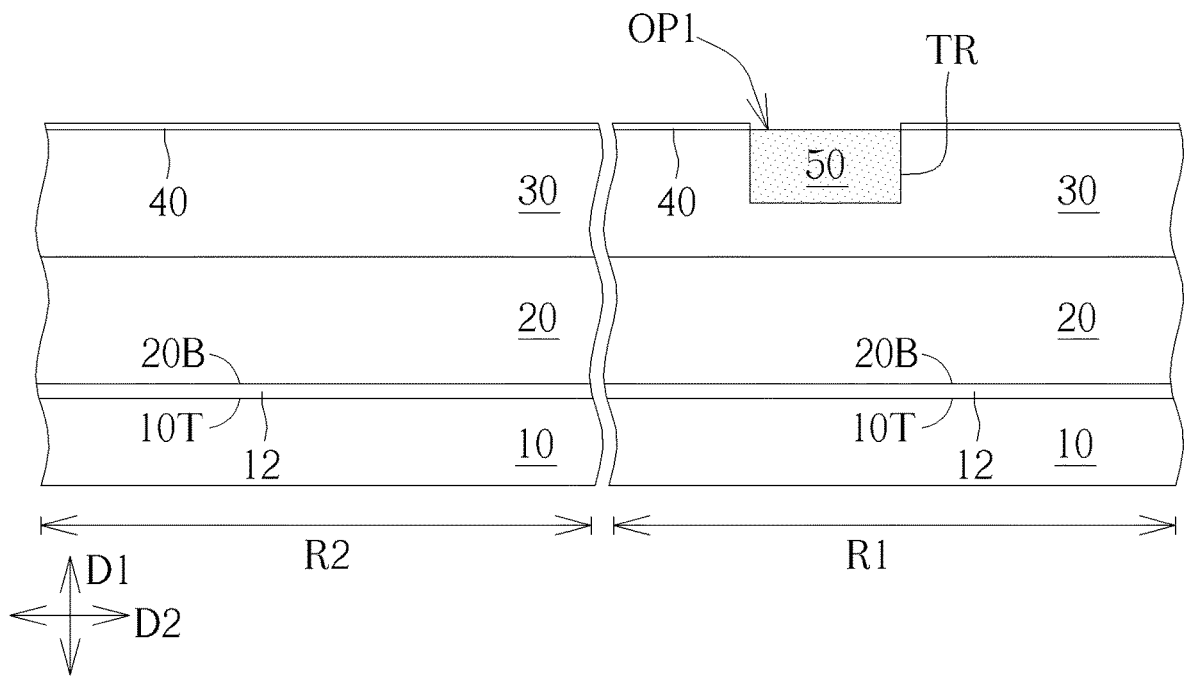
Figure 18:
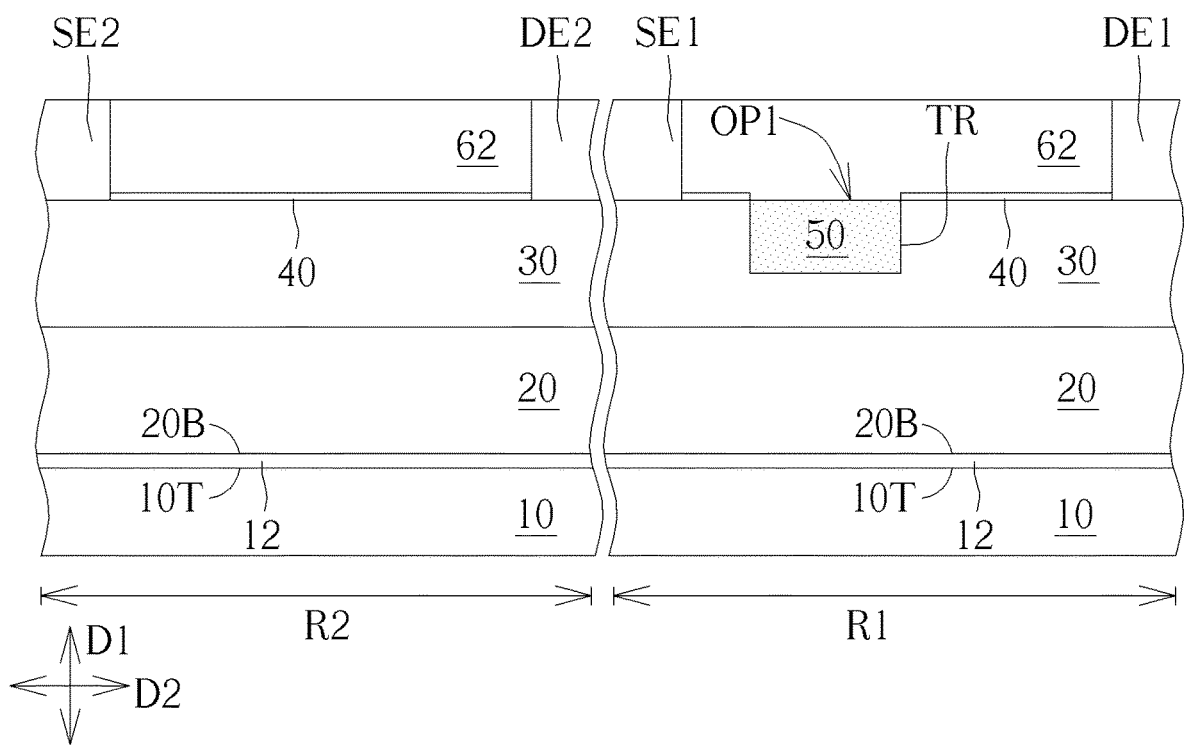

Please refer to FIGS. 15-18. FIG. 16 is a schematic flow chart of a manufacturing method of the semiconductor device 203 according to the seventh embodiment of the present invention, FIG. 17 and FIG. 18 are schematic drawings illustrating the manufacturing method of the semiconductor device in this embodiment, and FIG. 15 may be regarded as a schematic drawing in a step subsequent to FIG. 18. As shown in FIG. 16 and FIG. 17, in some embodiments, step S20 may be carried out for sequentially forming the buffer layer 12, the III-V compound semiconductor layer 20, the III-V compound barrier layer 30, and the insulation layer 40. The opening OP1 is then formed in the insulation layer 40 located on the first region R1, and the gate trench TR is formed in the III-V compound barrier layer 30 located above the first region R1. Subsequently, step S21 may be carried out for forming the p-type doped III-V compound layer 50 in the gate trench TR. The III-V compound barrier layer 30 located above the second region R2 may be completely covered by the insulation layer 40 during the step of forming the p-type doped III-V compound layer 50 for avoiding forming the p-type doped III-V compound layer 50 by the epitaxial growth process on the III-V compound barrier layer 30 located above the second region R2. Subsequently, as shown in FIG. 16 and FIG. 18, step S22 may be carried out for forming the dielectric layer 62 covering the insulation layer 40 and the p-type doped III-V compound layer 50. After the step of forming the dielectric layer 62, step S23 may be carried out for forming the source electrode SE1, the drain electrode DE1, the source electrode SE2, and the drain electrode DE2. Subsequently, as shown in FIG. 16 and FIG. 15, step S24 may be carried out for forming the dielectric layer 64 covering the dielectric layer 62, the source electrode SE1, the drain electrode DE1, the source electrode SE2, and the drain electrode DE2. Step S25 may be carried out afterward for forming the gate structure GE1 and the gate structure GE2. In other words, the gate electrode and the source/drain electrode may be formed by different manufacturing processes, respectively. The gate electrode GE1 and the gate electrode GE2 may be formed after the step of forming the source electrode SE1, the drain electrode DE1, the source electrode SE2, and the drain electrode DE2. The first transistor structure T1 and the second transistor structure T2 with different modes may be formed concurrently on the same substrate 10, and at least a part of the first transistor structure T1 and at least a part of the second transistor structure T2 (such as the gate electrodes or the source/drain electrodes) may be formed concurrently by the same process for manufacturing process simplification. In addition, because the enhancement mode of the first transistor structure T1 may be achieved by forming the gate trench TR in the III-V compound barrier layer 30 and forming the p-type doped III-V compound layer 50 in the gate trench TR, the first transistor structure T1 and the second transistor structure T2 with different modes may be manufactured on the same substrate 10, and some material layers (such as the buffer layer 12, the III-V compound semiconductor layer 20, and/or the III-V compound barrier layer 30) located corresponding to the first transistor structure T1 and the second transistor structure T2 may be formed concurrently on the same substrate 10.

To summarize the above descriptions, in the semiconductor device and the manufacturing method thereof according to the present invention, the p-type doped III-V compound layer may be formed in the gate trench located in the III-V compound barrier layer, and the top surface of the p-type doped III-V compound layer and the top surface of the III-V compound barrier layer may be substantially coplanar. The p-type doped III-V compound layer disposed in the gate trench may be used to reduce the electrical resistance of the semiconductor device and achieve positive threshold voltage in the semiconductor device. In addition, the p-type doped III-V compound layer may be formed in the gate trench by an epitaxial growth approach, it is not necessary to perform an etching process to the p-type doped III-V compound layer, and the negative influence of the etching process may be avoided accordingly. The material quality of the p-type doped III-V compound layer may be enhanced, the electrical performance of the semiconductor device may be improved, and/or the related manufacturing process steps may be simplified accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a III-V compound semiconductor layer;
   a III-V compound barrier layer disposed on the III-V compound semiconductor layer;
   a gate trench disposed in the III-V compound barrier layer; and
   a p-type doped III-V compound layer disposed in the gate trench, wherein a top surface of the p-type doped III-V compound layer and a top surface of the III-V compound barrier layer are substantially coplanar, and the top surface of the p-type doped III-V compound layer comprises a concave surface.
2. The semiconductor device according to claim 1, wherein a distance between the top surface of the p-type doped III-V compound layer and a bottom surface of the III-V compound barrier layer in a vertical direction is equal to a thickness of the III-V compound barrier layer in the vertical direction with a tolerance of ±10%.
3. The semiconductor device according to claim 1, wherein a ratio of a thickness of the p-type doped III-V compound layer in a vertical direction to a thickness of the III-V compound barrier layer in the vertical direction is less than 1 and greater than or equal to 0.8.
4. The semiconductor device according to claim 1, wherein the p-type doped III-V compound layer comprises a p-type doped aluminum gallium nitride layer, the III-V compound barrier layer comprises an aluminum gallium nitride layer, and an atomic concentration of aluminum in the p-type doped III-V compound layer is lower than an atomic concentration of aluminum in the III-V compound barrier layer.
5. The semiconductor device according to claim 1, wherein the p-type doped III-V compound layer comprises a p-type doped $Al_xGa_{1-x}N$ layer, and x is less than 1 and greater than 0.
6. The semiconductor device according to claim 1, wherein the p-type doped III-V compound layer comprises a p-type doped gallium nitride layer.
7. The semiconductor device according to claim 1, further comprising:
   an insulation layer disposed on the III-V compound barrier layer, wherein the insulation layer comprises an opening located corresponding to the gate trench in a vertical direction; and
   a gate electrode disposed on the p-type doped III-V compound layer.
8. The semiconductor device according to claim 7, wherein a part of the gate electrode is disposed on the insulation layer in the vertical direction.
9. The semiconductor device according to claim 7, wherein the top surface of the p-type doped III-V compound layer is lower than a top surface of the insulation layer in the vertical direction.

* * * * *